(12) United States Patent
Shibayama et al.

(10) Patent No.: US 7,545,044 B2
(45) Date of Patent: Jun. 9, 2009

(54) SEMICONDUCTOR DEVICE AND RADIATION DETECTOR EMPLOYING IT

(75) Inventors: Katsumi Shibayama, Hamamatsu (JP); Yutaka Kusuyama, Hamamatsu (JP); Masahiro Hayashi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 17 days.

(21) Appl. No.: 10/546,601

(22) PCT Filed: Feb. 24, 2004

(86) PCT No.: PCT/JP2004/002132

§ 371 (c)(1),
(2), (4) Date: Oct. 17, 2006

(87) PCT Pub. No.: WO2004/075281

PCT Pub. Date: Sep. 2, 2004

(65) Prior Publication Data

US 2007/0029670 A1 Feb. 8, 2007

(30) Foreign Application Priority Data

Feb. 24, 2003 (JP) ............................. 2003-046141

(51) Int. Cl.
*H01L 23/52* (2006.01)
*H01L 23/48* (2006.01)
*H01L 29/40* (2006.01)

(52) U.S. Cl. ............................. 257/774; 257/E23.067; 257/734; 257/737; 250/214.1; 250/370.11; 438/667

(58) Field of Classification Search .......... 257/E23.004, 257/734, 667, 737, 774, 776, 777, 432, 435, 257/E23.067, E31.129; 250/214.1, 216, 250/370.11, 208.1, 370.09; 438/666, 667, 438/672
See application file for complete search history.

(56) References Cited

U.S. PATENT DOCUMENTS 4,153,988 A * 5/1979 Doo ............................. 29/827

(Continued)

FOREIGN PATENT DOCUMENTS

EP 1 148 349 10/2001

(Continued)

*Primary Examiner*—Chris C. Chu
(74) *Attorney, Agent, or Firm*—Drinker Biddle & Reath LLP

(57) ABSTRACT

A wiring substrate 20, comprising a glass substrate, formed by integrally bundling a plurality of glass fibers and provided with through holes 20c, and conductive members 21, disposed at through holes 20c, is used. Input portions 21a of conductive members 21, formed on an input surface 20a of this wiring substrate 20, are connected to bump electrodes 17, which are provided on an output surface 15b of a PD array 15 in one-to-one correspondence with respect to conductive members 21, thereby arranging a semiconductor device 5. A radiation detector is arranged by connecting a scintillator 10 via an optical adhesive agent 11 to a light-incident surface 15a of PD array 15 and connecting a signal processing element 30 via bump electrodes 31 to output surface 20b of wiring substrate 20. A semiconductor device, with which the semiconductor elements and the corresponding conductive paths of the wiring substrate are connected satisfactorily, and a radiation detector using this semiconductor device are thus provided.

10 Claims, 11 Drawing Sheets

U.S. PATENT DOCUMENTS

| | | | | |
|---|---|---|---|---|
| 5,699,610 | A * | 12/1997 | Shimada et al. | 29/840 |
| 5,783,865 | A * | 7/1998 | Higashiguchi et al. | 257/774 |
| 5,962,922 | A * | 10/1999 | Wang | 257/773 |
| 6,114,240 | A * | 9/2000 | Akram et al. | 438/667 |
| 6,396,898 | B1 * | 5/2002 | Saito et al. | 378/19 |
| 6,400,172 | B1 * | 6/2002 | Akram et al. | 324/765 |
| 6,492,597 | B2 * | 12/2002 | Fujii et al. | 174/255 |
| 6,495,845 | B1 * | 12/2002 | Tsunota et al. | 250/505.1 |
| 6,510,195 | B1 | 1/2003 | Chappo et al. | 378/19 |
| 6,625,036 | B1 * | 9/2003 | Horio | 361/760 |
| 6,791,178 | B2 * | 9/2004 | Yamaguchi et al. | 257/699 |
| 7,183,650 | B2 * | 2/2007 | Shiono et al. | 257/758 |
| 7,326,907 | B2 * | 2/2008 | Shibayama et al. | 250/214.1 |
| 2002/0038851 | A1 | 4/2002 | Kajiwara et al. | 250/368 |

FOREIGN PATENT DOCUMENTS

| | | | |
|---|---|---|---|
| EP | 1 589 581 | | 10/2005 |
| EP | 1 589 582 | | 10/2005 |
| JP | 02-164045 | | 6/1990 |
| JP | 03-203341 | | 9/1991 |
| JP | 07-333348 | | 12/1995 |
| JP | 08-330469 | | 12/1996 |
| JP | 10-275984 | | 10/1998 |
| JP | 11-121648 | | 4/1999 |
| JP | 2002064263 A | * | 2/2002 |
| JP | 2003-264280 | | 9/2003 |
| WO | 02/06865 | | 1/2002 |

* cited by examiner

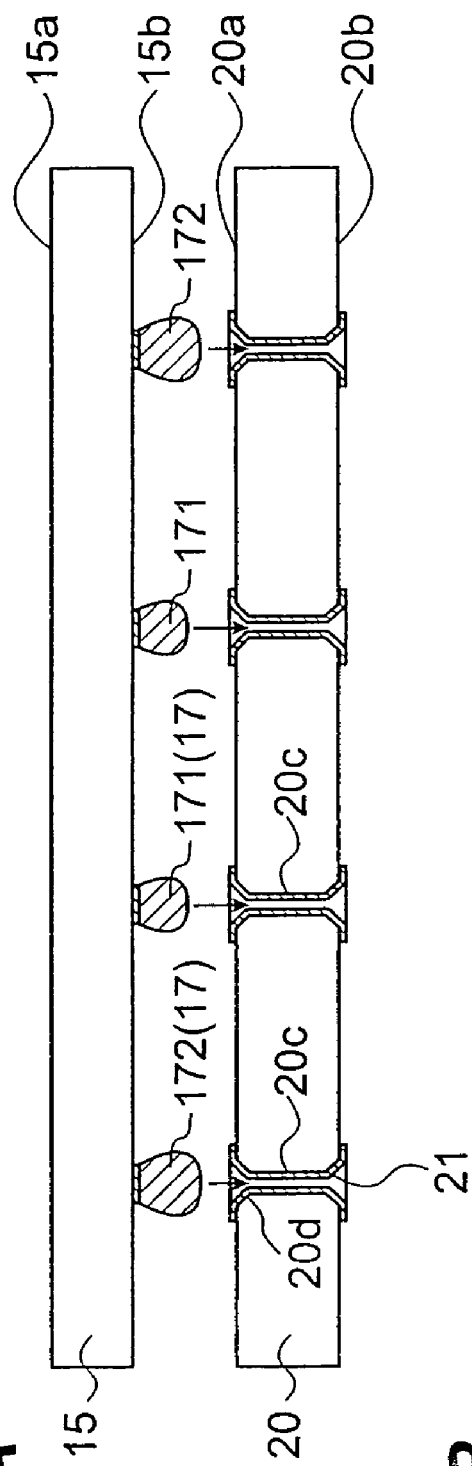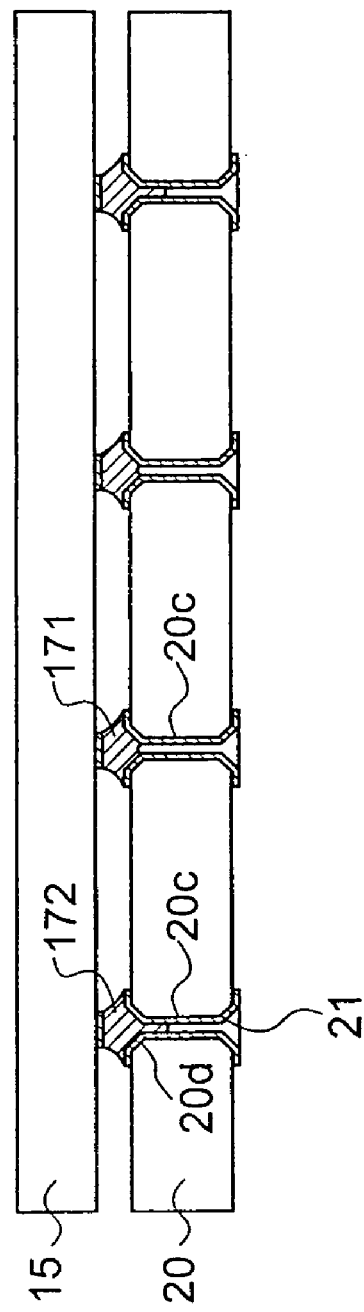
Fig.5A
Fig.5B

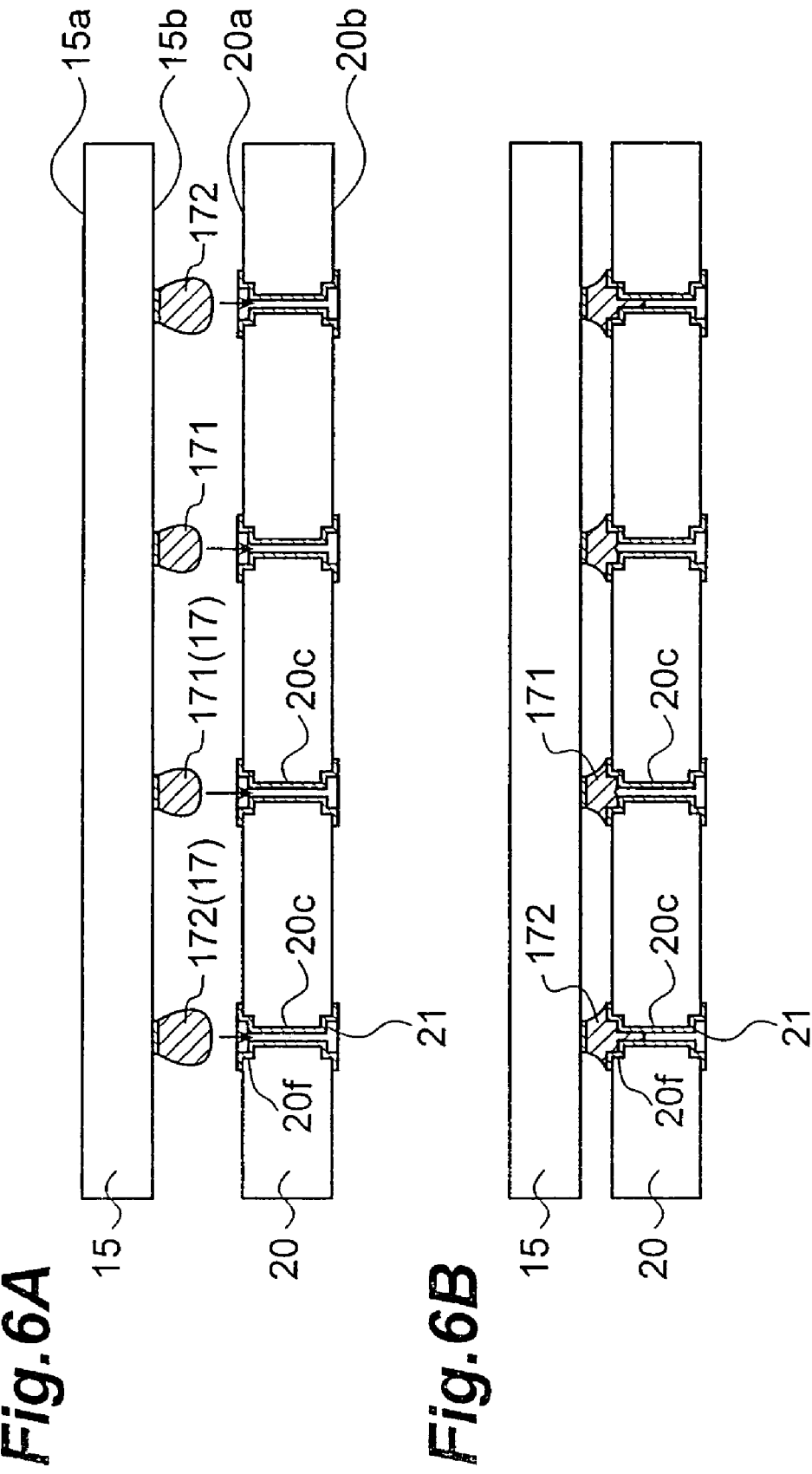

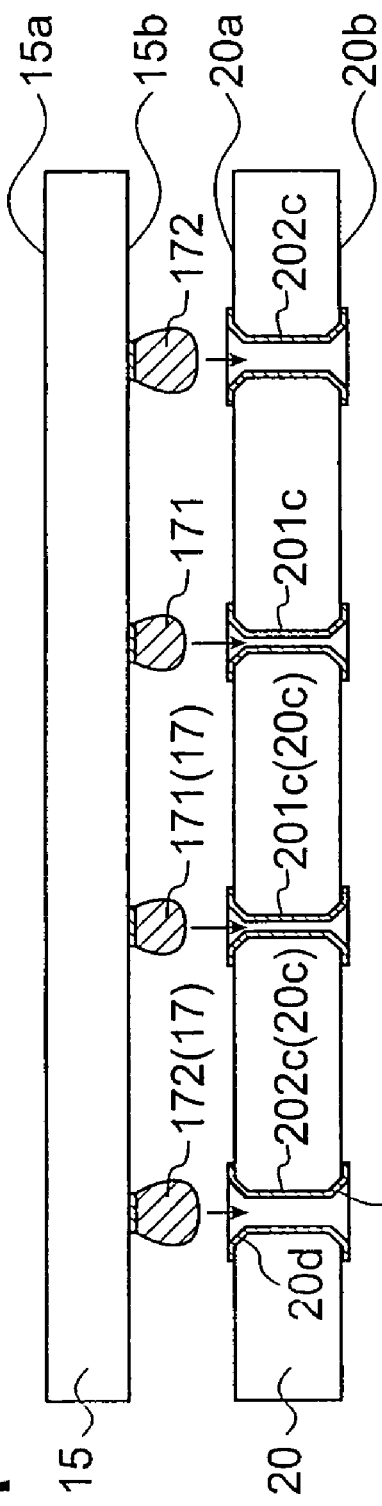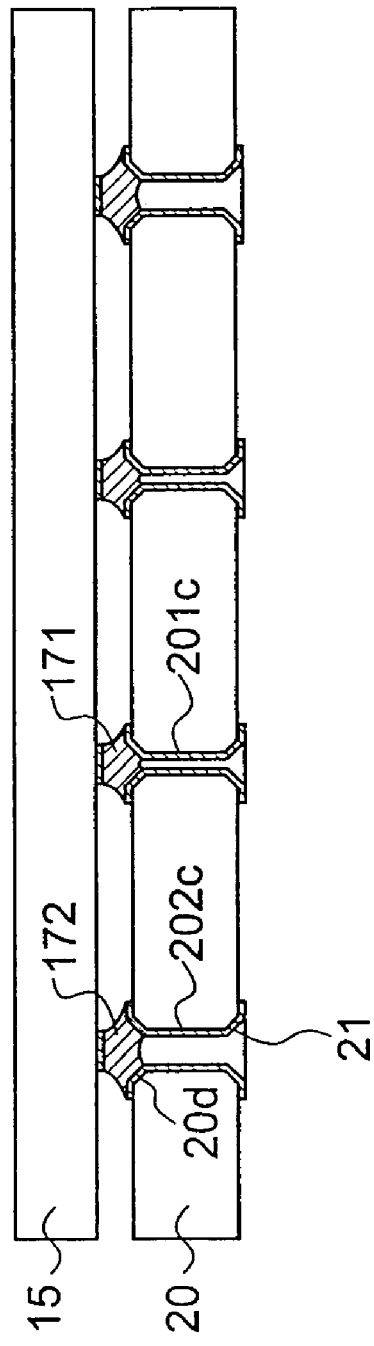

DRAWING

DRAWING

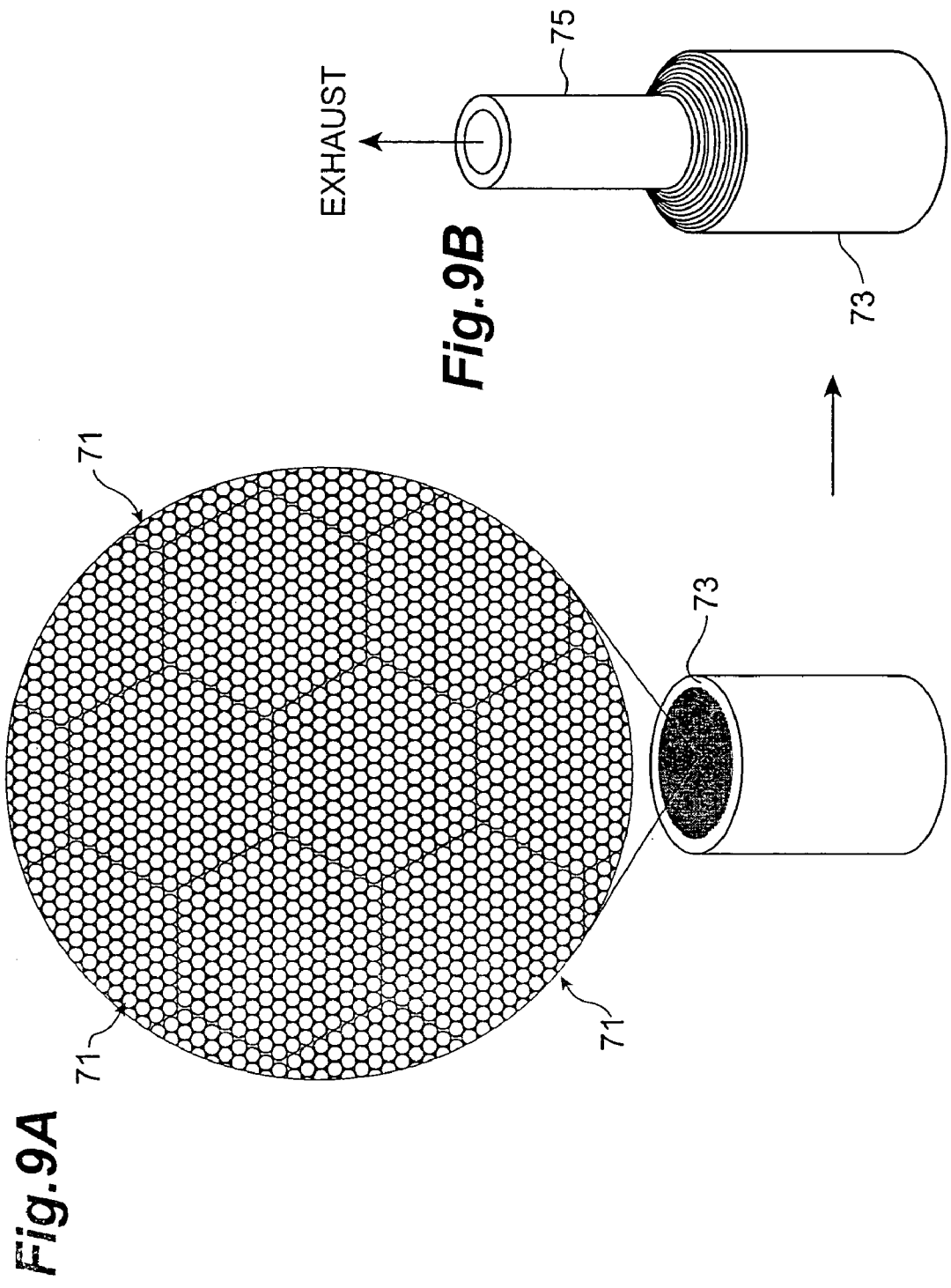

and a signal output surface, and connected to the semiconductor element at the signal input surface; and wherein (3) the wiring substrate comprises: a glass substrate, formed by cutting a bundle-form glass member, formed by bundling fiber-form glass members, each comprising a core glass portion and a coating glass portion, provided at the periphery of the core glass portion, to a desired thickness and provided with a through hole by the removal of the core glass portion; and a conductive member, disposed in the through hole and functioning as the conduction path by providing electrical continuity between the signal input surface and the signal output surface; and (4) the semiconductor element and the corresponding conductive member of the wiring substrate are electrically connected via a bump electrode that is formed in one-to-one correspondence with respect to the conductive member.

SEMICONDUCTOR DEVICE AND RADIATION DETECTOR EMPLOYING IT

TECHNICAL FIELD

This invention concerns a semiconductor device, provided with a wiring substrate that is provided with a conduction path that guides an electrical signal, and a radiation detector using this semiconductor device.

BACKGROUND ART

As a radiation detector for use in a CT sensor, etc., there is a detector of an arrangement wherein a scintillator is disposed on a light-incident surface of a semiconductor photodetecting element, which is a semiconductor element. With such a radiation detector, when an X-ray, γ-ray, charged particle beam or other radiation to be detected is made incident on the scintillator, scintillation light is generated inside the scintillator by the radiation. The semiconductor photodetecting element then detects the scintillation light that is made incident from the scintillator and output an electrical signal that is in accordance with the intensity of the radiation.

Also, in order to carry out signal processing of the electrical signal output from the semiconductor photodetecting element, a signal processing element is provided. As an arrangement for electrically connecting the semiconductor element with the signal processing element and transmitting the electrical signal, an arrangement is used wherein a semiconductor device is arranged in one united body by connecting the semiconductor element to a wiring substrate that is provided with a conduction path and the signal processing element is connected to the wiring substrate of this semiconductor device. Such a semiconductor device using a wiring substrate is used in various applications besides radiation detectors (see for example, Japanese Patent No. 2555720 and Japanese Patent Application Laid-Open No. H3-203341).

DISCLOSURE OF THE INVENTION

With a semiconductor device of an arrangement wherein the wiring substrate is connected to the semiconductor element, in mounting the chip of the semiconductor element by flip-chip bonding onto the wiring substrate, the semiconductor element and the corresponding conduction path of the wiring substrate are electrically connected via a bump electrode provided on the semiconductor element.

With such an arrangement, it is important to physically and electrically connect the semiconductor element and the wiring substrate in a stable manner. However, with a connection arrangement using bump electrodes such as that described above, excessive collapsing of large bump electrodes, contacting of adjacent bump electrodes with each other, and other problems in the connection of the semiconductor element and the wiring substrate arise due to the sizes, heights, positions, etc., of the bump electrodes.

This invention has been made to resolve the above issue and an object thereof is to provide a semiconductor device, with which the semiconductor element and the corresponding conduction path of the wiring substrate are connected satisfactorily, and a radiation detector using such a semiconductor device.

In order to achieve this object, this invention provides a semiconductor device comprising: (1) a semiconductor element, outputting an electrical signal; and (2) a wiring substrate, provided with a conduction path, guiding the electrical signal between a signal input surface and a signal output surface, and connected to the semiconductor element at the signal input surface; and wherein (3) the wiring substrate comprises: a glass substrate, formed by cutting a bundle-form glass member, formed by bundling fiber-form glass members, each comprising a core glass portion and a coating glass portion, provided at the periphery of the core glass portion, to a desired thickness and provided with a through hole by the removal of the core glass portion; and a conductive member, disposed in the through hole and functioning as the conduction path by providing electrical continuity between the signal input surface and the signal output surface; and (4) the semiconductor element and the corresponding conductive member of the wiring substrate are electrically connected via a bump electrode that is formed in one-to-one correspondence with respect to the conductive member.

With the above-described semiconductor device, a glass substrate, which is formed integrally from a plurality of glass fibers and having a through hole, extending from the input surface to the output surface, formed at a predetermined position thereof, is used as the wiring substrate that connects the semiconductor photodetecting element or other semiconductor element. A bump electrode of the semiconductor element is made to correspond in a one-to-one manner with the through hole and conductive member to connect the semiconductor element with the conductive member, which is the conduction path of the wiring substrate.

With such an arrangement, in mounting the semiconductor element onto the wiring substrate, a portion of the bump electrode enters into the interior of a through hole that is provided with a conductive member. A semiconductor device, with which the semiconductor element and the corresponding conduction path of the wiring substrate are connected satisfactorily via the bump electrode, is thus realized. Here, in regard to the arrangement of the conduction path of the wiring substrate, the conductive member is preferably formed on the inner wall of the through hole provided in the glass substrate.

Also, the through hole of the glass substrate are preferably formed so that the opening area at the signal input surface is larger than the opening area at a predetermined position in the interior of the glass substrate. With such an arrangement, since the through hole is made large in opening area at the side at which the bump electrode is connected, the bump electrode can be connected securely to the conductive member provided at the through hole.

In regard to the specific arrangement of the through hole, it is preferable that the through hole in the glass substrate has a predetermined range thereof at the signal input surface side formed to a tapered shape, with which the opening area decreases gradually from the signal input surface towards the interior of the glass substrate. Or, it is preferable that the through hole in the glass substrate has a predetermined range thereof at the signal input surface side formed to a recessed shape of a predetermined opening area that is greater than the opening area in a range that includes a predetermined position in the interior of the glass substrate.

Also, the glass substrate may have an arrangement provided with, as the through hole, at least a first through hole of a predetermined opening area and a second through hole that differs in opening area from the first through hole. With such an arrangement, the opening areas of the through holes can be set favorably in accordance with the size, height, etc., of the bump electrodes that are to be connected to the conductive members provided at the through holes.

Signal processing means, which is connected to the signal output surface of the wiring substrate and processes the electrical signal from the semiconductor element may furthermore be provided. A semiconductor device, wherein the electrical signal output from the semiconductor element is processed by the signal processing means, is thereby achieved.

This invention's radiation detector is a radiation detector arranged so as to include the above-described semiconductor device and comprises: (a) radiation detecting means that includes the semiconductor element and outputs the electrical signal upon detection of incident radiation; (2) signal processing means, processing the electrical signal from the radiation detecting means; and (3) a wiring substrate section, including the wiring substrate and having the signal input surface and the signal output surface being connected to the radiation detecting means and the signal processing means, respectively.

With the above-described radiation detector, the wiring substrate, which comprises the above-described semiconductor device along with the semiconductor element included in the radiation detecting means, is used as the wiring substrate section that electrically connects the radiation detecting means and the signal processing means and transmits the detected signal, which is the electrical signal. With such an arrangement, since the semiconductor element and the corresponding conductive member of the wiring substrate are connected satisfactorily, a radiation detector is realized with which the transmission of the detected signal from the radiation detecting means to the signal processing means and the processing of the detected signal at the signal processing means can be performed reliably.

In applying the above-described semiconductor device to a radiation detector, the glass substrate used in the wiring substrate is preferably formed of a predetermined glass material having a radiation shielding function. The transmission of radiation from the radiation detecting means to the signal processing means can thereby be restrained. A glass material containing lead can be cited as an example of such a glass material.

In regard to the arrangement of the radiation detecting means, the radiation detecting means can be arranged with a scintillator, which generates scintillation light upon incidence of radiation, and a semiconductor photodetecting element, which detects the scintillation light from the scintillator. Also, an arrangement having a semiconductor detecting element that detects the incident radiation may be used instead as the radiation detecting means.

BRIEF DESCRIPTION OF THE DRAWINGS

FIG. 5A and FIG. 5B are diagrams showing an example of the arrangement of through holes and conductive members in a wiring substrate and the connection of these components with bump electrodes.

FIG. 6A and FIG. 6B are diagrams showing another example of the arrangement of through holes and conductive members in a wiring substrate and the connection of these components with bump electrodes.

FIG. 7A and FIG. 7B are diagrams showing another example of the arrangement of through holes and conductive members in a wiring substrate and the connection of these components with bump electrodes.

FIG. 9A and FIG. 9B are diagrams showing an example of a method of manufacturing a wiring substrate.

BEST MODES FOR CARRYING OUT THE INVENTION

Preferred embodiments of this invention's semiconductor device and radiation detector using the same shall now be described in detail along with the drawings. In the description of the drawings, the same elements shall be provided with the same symbols and overlapping description shall be omitted. Also, the dimensional proportions of the drawings do not necessary match those of the description.

Figure 1:
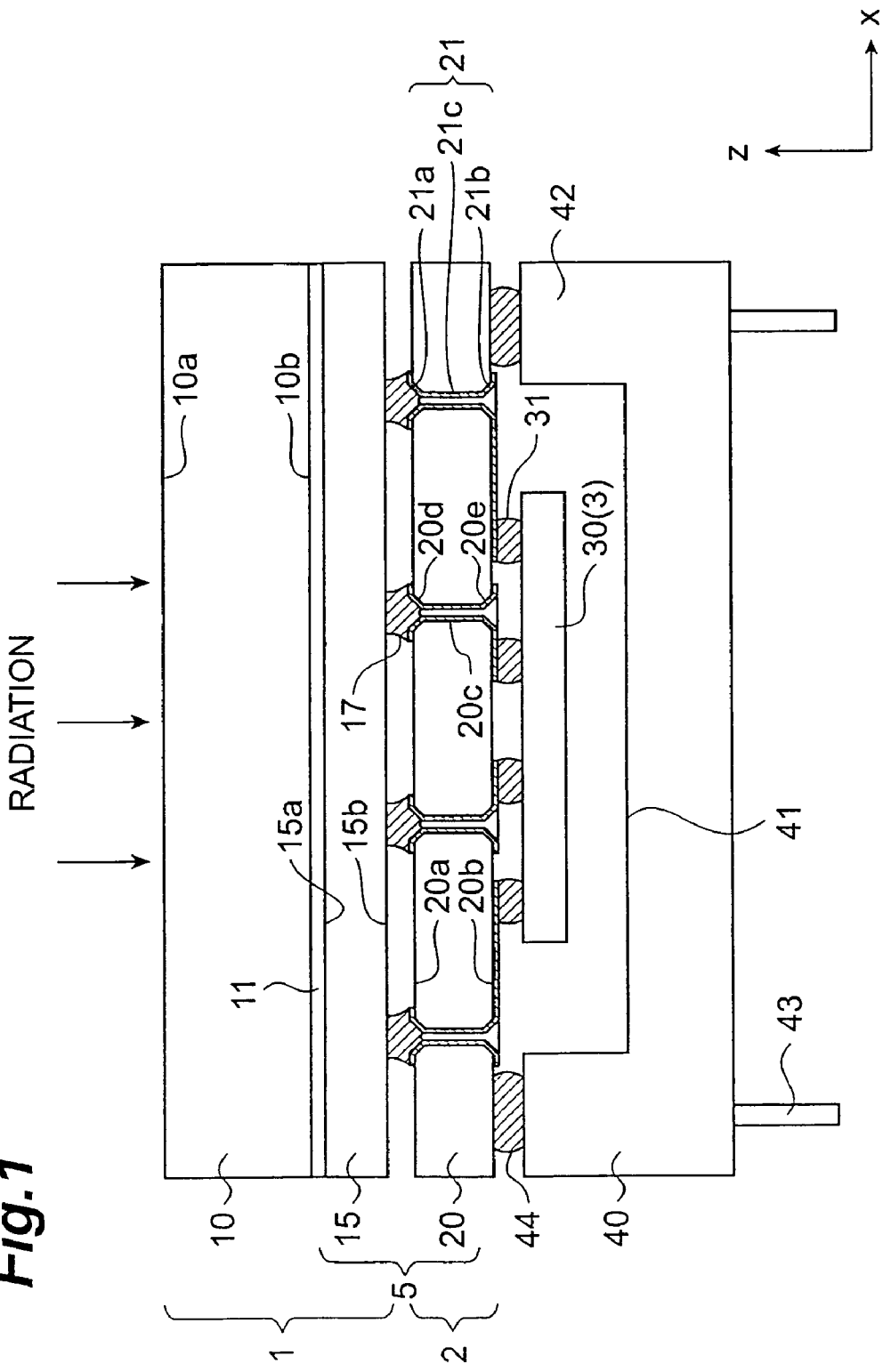
FIG. 1 is a sectional side view showing the cross-sectional structure of an embodiment of a semiconductor device and a radiation detector using the same.
Figure 2:
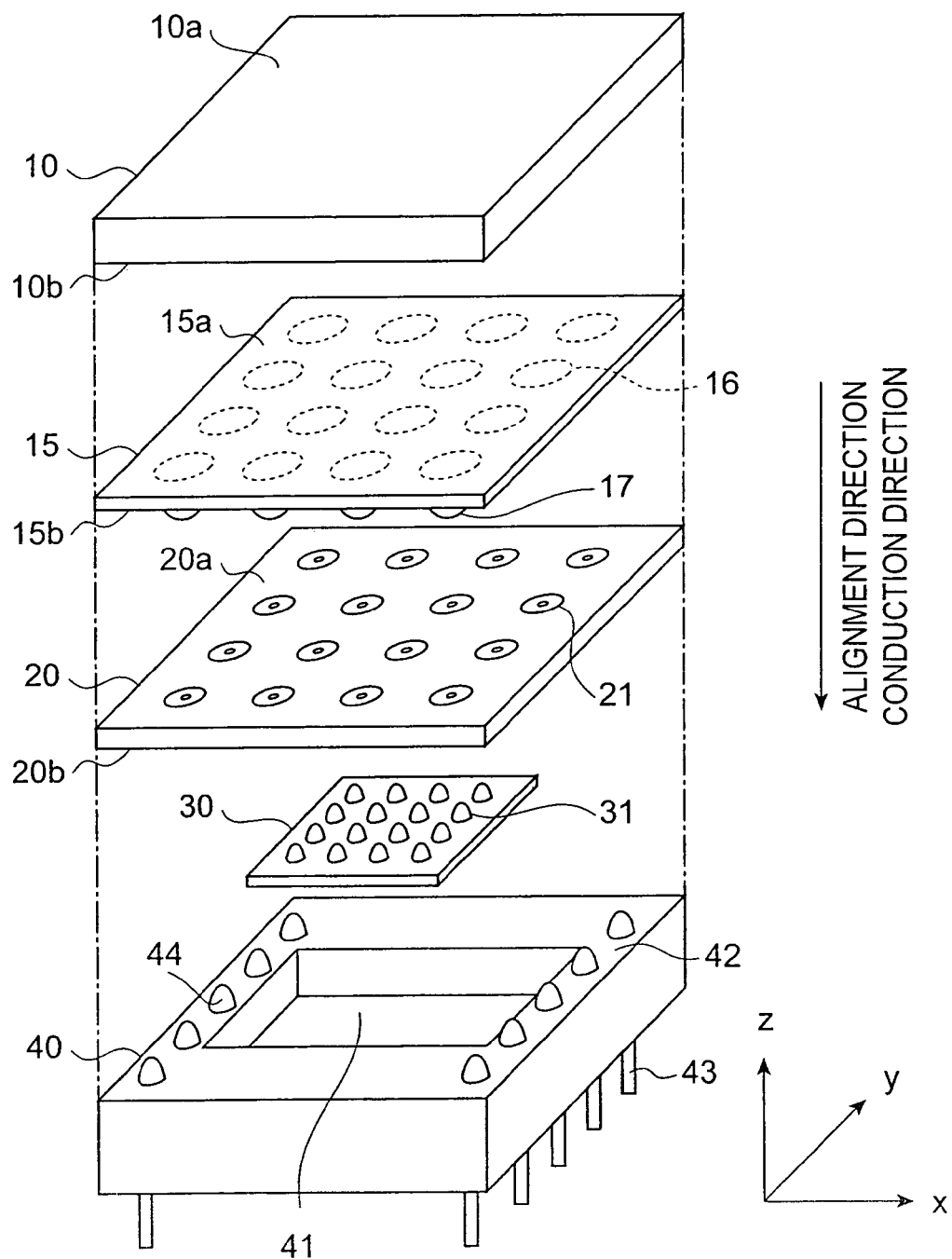
FIG. 2 is a perspective view showing the arrangement of the radiation detector of FIG. 1 in an exploded manner.

FIG. 1 is a sectional side view showing the cross-sectional structure of an embodiment of this invention's semiconductor device and radiation detector. FIG. 2 is a perspective view showing the arrangement of the semiconductor device and the radiation detector shown in FIG. 1 with the respective components being shown in exploded manner. As shown in FIG. 1 and FIG. 2, for the convenience of description, an axis along the direction of incidence of radiation shall be taken as the z-axis and two axes orthogonal to the z-axis shall be taken as the x-axis and the y-axis in the drawings that follows. Here, the negative direction of the z-axis is the conduction direction from a signal input surface to a signal output surface of a wiring substrate and is the alignment direction of the respective components of the radiation detector.

The radiation detector shown in FIG. 1 is provided with a scintillator 10, a semiconductor device 5, and a signal processing section 3. As shown in FIG. 2, these are positioned in that order from the upstream side (upper side of the figure) to the downstream side (lower side) along the predetermined alignment direction.

The arrangement of semiconductor device 5, which comprises a photodiode array 15 and a wiring substrate 20, shall now be described.

Photodiode array (PD array) 15 comprises an upstream side portion of semiconductor device 5. This PD array 15 is a semiconductor photodetecting element array in which a plurality of photodiodes (PDs), which are semiconductor elements that detect incident light and output electrical signals corresponding to the incident light intensity, are arrayed.

As an arrangement example of PD array 15, a PD array, wherein 4×4=16 photodiodes 16 are arrayed in two dimensions with the x-axis and the y-axis as alignment axes, is shown in FIG. 2. A lower surface 15b of PD array 15 is a signal output surface for outputting detected signals from the respective photodiodes 16. At this signal output surface 15b, 16 bump electrodes 17, which are detected signal output electrodes, are arrayed in a 4×4 manner in correspondence with the respective photodiodes 16. Though not illustrated in particular, bump electrodes that serve as substrate electrodes (common electrodes) take on the same form as the electrodes for the output of the detected signals.

Wiring substrate 20 comprises a downstream side portion of semiconductor device 5. This wiring substrate 20 is provided with conduction paths that guide electrical signals between a signal input surface 20a and a signal output surface 20b and the above-described PD array 15 is connected to signal input surface 20a.

Specifically, a glass substrate, arranged by forming a bundle-form glass member by bundling fiber-form glass members (glass fibers), each comprising a core glass portion and a coating glass portion, provided at the periphery of the core glass portion, and cutting the bundle-form glass member to a desired thickness in a predetermined direction that intersects the axes of the glass fibers, is used as wiring substrate 20. In the present embodiment, since semiconductor device 5 is applied to a radiation detector, a lead glass material, which contains lead or other predetermined glass material having a radiation shielding function, is used as the glass material of wiring substrate 20.

Figure 3A:
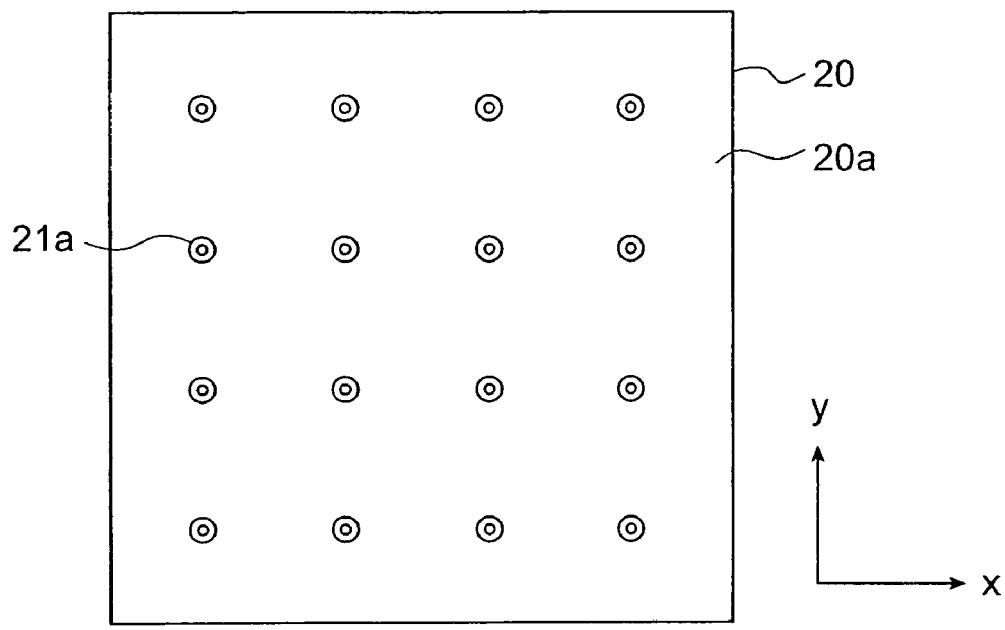
FIG. 3A and FIG. 3B are plan views respectively showing the arrangement of (A) a signal input surface and (B) a signal output surface of the wiring substrate.
Figure 3B:
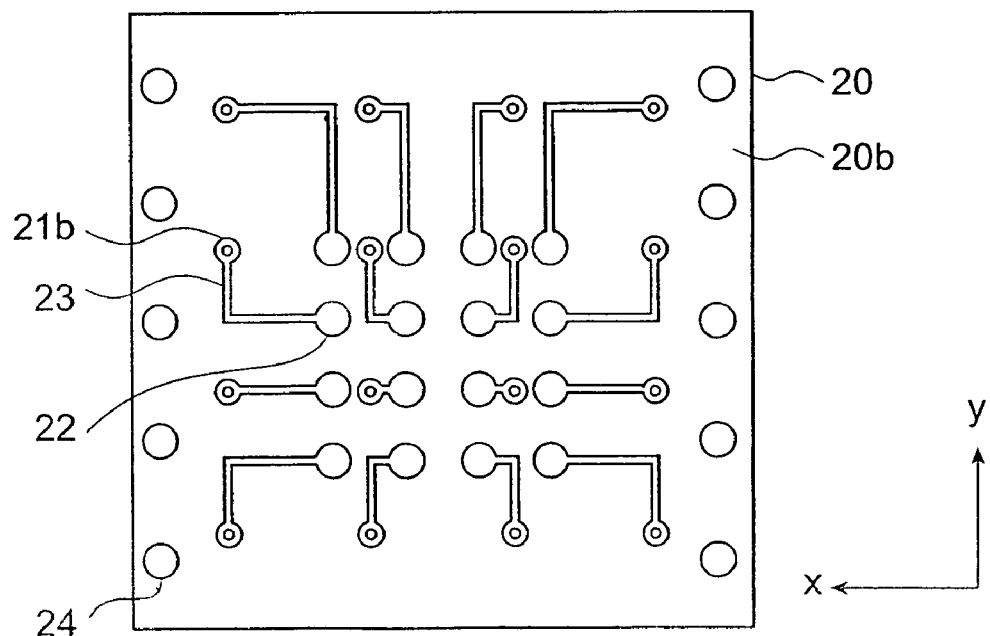

FIG. 3A and FIG. 3B are respectively plan views showing the arrangement of wiring substrate 20, with FIG. 3A showing signal input surface 20a, which is the upper surface, and FIG. 3B showing signal output surface 20b, which is the lower surface. Only the principal portions are shown in these figures and illustration of portions corresponding to the substrate electrodes of the PD array, etc., are omitted from illustration.

Figure 4A:
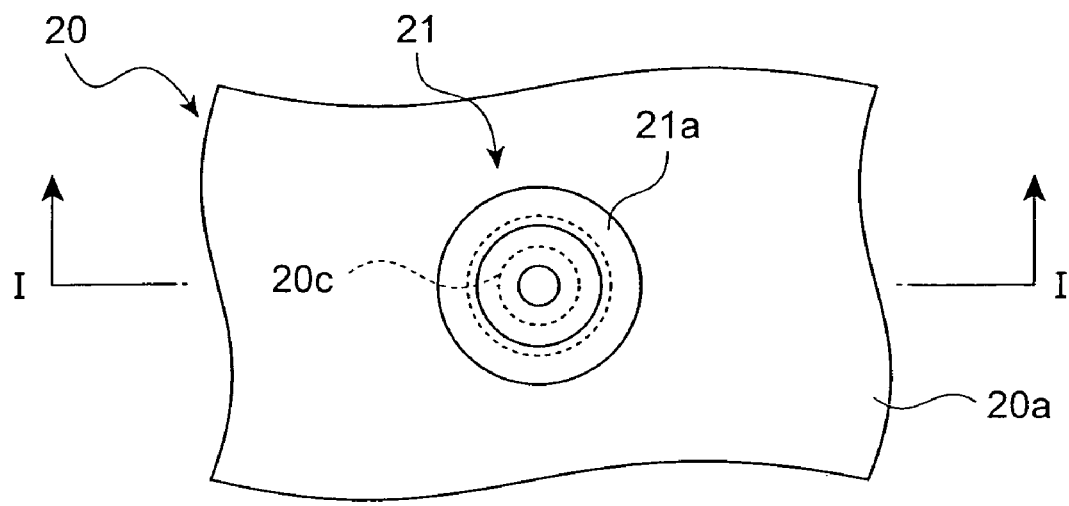
FIG. 4A and FIG. 4B are diagrams showing an example of the arrangement of a through hole of the wiring substrate and a conductive member disposed in the through hole.
Figure 4B:
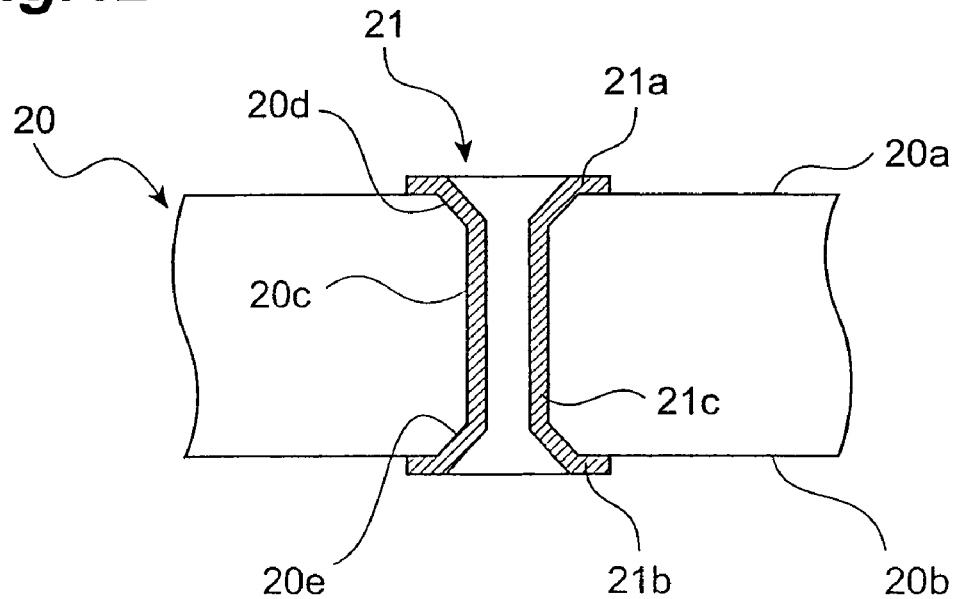

FIG. 4A and FIG. 4B are drawings showing an example of the arrangement of a through hole 20c of a wiring substrate 20 and a conductive member 21 provided in through hole 20c, with FIG. 4A being a top view and FIG. 4B being a section taken on arrows I-I.

In the glass substrate that comprises wiring substrate 20, through holes 20c are formed so as to extend from signal input surface 20a toward signal output surface 20b by the removal of the core glass portions at the centers of predetermined glass fibers among the plurality of glass fibers included in the glass substrate. Also, for each through hole 20c, a conductive member 21, which provides electrical continuity between input surface 20a and output surface 20b and functions as a conduction path, is provided. In the present embodiment, 4×4=16 through holes 20c and conductive members 21 are provided in correspondence with the arrangement of PD array 15. These through holes 20c and conductive members 21 are formed at the same pitch as bump electrodes 17 on PD array 15.

A plurality (for example, 4×4=16) of through holes 20c are formed and arrayed two-dimensionally in wiring substrate 20. As shown in FIG. 4B, each through hole 20c is formed to have a circular cross-sectional shape with an axis perpendicular to input surface 20a and output surface 20b of wiring substrate 20 as its central axis. Also, in the present embodiment, a predetermined range at the signal input surface 20a side of through hole 20c is formed as a tapered part 20d of tapered shape with which the opening area decreases successively from input surface 20a towards the interior of the glass substrate. Also, a predetermined range at the signal output surface 20b side is formed as a tapered part 20e of tapered shape with which the opening area decreases successively from output surface 20b towards the interior.

With these through holes 20c, conductive members 21, each of which provides electrical continuity between input surface 20a and output surface 20b, are provided as members formed on the inner walls of through holes 20c. Specifically, as shown in FIG. 4A and FIG. 4B, a conducting portion 21c is formed at the inner wall of the interior of each through hole 20c that includes tapered parts 20d and 20e. Also, an input portion 21a, which is continuous with conducting portion 21c, is formed on input surface 20a at an outer peripheral portion of tapered part 20d. Furthermore, an output portion 21b, which is continuous with conducting portion 21c, is formed on output surface 20b at an outer peripheral portion of tapered part 20e. Each conductive member 21, which is to serve as a conduction path of wiring substrate 20, is arranged by conducting portion 21c, input portion 21a, and output portion 21b.

As shown in FIG. 3A, input portions 21a of conductive members 21 are disposed on input surface 20a of wiring substrate 20 at positions corresponding to bump electrodes 17 on output surface 15b of PD array 15. Here, bump electrodes 17 of PD array 15 are made to correspond in a one-to-one manner with through holes 20c and conductive members 21 of wiring substrate 20, and input parts 21a are arranged as electrode pads to which bump electrodes 17 are connected.

Each bump electrode 17 is connected to the corresponding conductive member 21 of wiring substrate 20 in a manner such that a portion of bump electrode enters into the interior of through hole 20c in which conductive member 21 is disposed. Photodiodes 16, which output the detected signals at PD array 15, are thus electrically connected via bump electrodes 17 to conductive members 21, which are the conduction paths of wiring substrate 20 that transmit the detected signals.

On output surface 20b of wiring substrate 20, electrode pads 22 are formed in addition to output portions 21b of conductive members 21 as shown in FIG. 3B. Electrode pads 22 are electrically connected via wirings 23 to output portions 21b of the corresponding conductive members 21. Electrode pads 24 are also formed on output surface 20b. These electrode pads 24 are used for connection with a housing 40 to be described later.

The arrangement of a radiation detector that includes the above-described semiconductor device 5 shall now be described.

A scintillator 10 is disposed at the upstream side of PD array 15 of semiconductor device 5, and an upper surface 10a thereof is arranged as a radiation-incident surface of the radiation detector. Upon incidence of an X-ray, γ-ray, charged particle beam or other radiation from incident surface 10a, scintillator 10 generates scintillation light of a predetermined wavelength. A light exit surface 10b, which is the lower surface of scintillator 10, and a light-incident surface 15a, which is the upper surface of PD array 15, are optically connected and bonded together via an optical adhesive agent 11 that allows the transmission of the scintillation light.

Here, a radiation detecting section 1 of the present radiation detector is arranged by scintillator 10 and PD array 15. This radiation detecting section 1 is a detecting means that detects radiation made incident thereon and outputs detected signals as electrical signals that correspond to the intensity of the radiation. A wiring substrate section 2, which connects radiation detecting section 1 and signal processing section 3, is arranged from wiring substrate 20.

Signal processing section 3 and housing (package) 40 are disposed at the downstream side of wiring substrate 20 of semiconductor device 5. In the present embodiment, signal processing section 3 comprises a signal processing element 30, provided with a signal processing circuit for processing the detected signals from PD array 15.

Bump electrodes 31 are formed on the upper surface of signal processing element 30. These bump electrodes 31 are disposed at positions corresponding to electrode pads 22 on output surface 20b of wiring substrate 20. Conductive members 21, which are the conduction paths of wiring substrate 20 that transmit the detected signals, are thus electrically connected via output portions 21b, wirings 23, electrode pads 22, and bump electrodes 31 to the signal processing circuit provided in signal processing element 30.

Though just the bump electrodes corresponding to signal output of the PD array are shown in the figure, the drive signals of the signal processing circuit and the output signals from the signal processing circuit are likewise connected via bump electrodes to predetermined electrode pads on output surface 20b of wiring substrate 20 and electrically connected to predetermined leads 43 via electrode pads 24 on output surface 20b of wiring substrate 20 and bump electrodes 44 on housing 40.

Housing 40 is a holding member that integrally holds scintillator 10, semiconductor device 5, which is comprised of PD array 15 and wiring substrate 20, and signal processing element 30. This housing 40 has an element housing part 41, which is provided as a recessed part on the upper surface of the housing and houses signal processing element 30 in the interior thereof, and a supporting part 42, which is disposed at the outer periphery of element housing part 41, is connected via bump electrodes 44 to electrode pads 24 of wiring substrate 20, and supports scintillator 10, semiconductor device 5, and signal processing element 30. Leads 43, used for input and output of electrical signals with respect to the exterior, are provided on the lower surface of housing 40.

With the above-described arrangement, when an X-ray or other radiation is made incident on scintillator 10 of radiation detecting section 1, scintillation light is generated in scintillator 10 by the radiation and is made incident, via optical adhesive agent 11, onto photodiodes 16 of PD array 15, which are the semiconductor elements. Photodiodes 16 detect the scintillation light and output electrical signals that are in accordance with the intensity of the radiation.

The electrical signals output from the respective photodiodes 16 of PD array 15 are input, successively via the corresponding bump electrodes 17, conductive members 21 of wiring substrate 20, and bump electrodes 31, into signal processing element 30. Signal processing is then carried out at the signal processing circuit of signal processing element 30.

The effects of this embodiment's semiconductor device and radiation detector shall now be described.

With semiconductor device 5, illustrated in FIG. 1 to FIG. 4A and FIG. 4B, a glass substrate, which is formed integrally from a plurality of glass fibers and having through holes 20c formed at predetermined positions thereof by the removal of core glass portions, is used as wiring substrate 20 that connects PD array 15, which is a semiconductor element array. Wiring substrate 20 can thus be arranged by a glass substrate, wherein through holes 20c for disposing conductive members 21 are formed to have the desired hole diameter and pitch. For example, with a glass substrate with such an arrangement, through holes 20c can be formed to have a microscopic hole diameter and pitch. Wiring substrate 20 can also be readily made large in area and thin.

Also, photodiodes 16 of PD array 15, which are the semiconductor elements, and conductive members 21, which are the conduction paths of wiring substrate 20, are connected upon making bump electrodes 17 of PD array 15 correspond in a one-to-one manner with through holes 20c and conductive members 21, formed at through holes 20c. Bump electrodes 17 and conductive members 21 can thus be connected satisfactorily.

Also with the radiation detector to which semiconductor device 5 is applied, wiring substrate 20, which comprises semiconductor device 5 along with PD array 15 that is included in radiation detecting section 1, is used as wiring substrate section 2 that electrically connects radiation detecting section 1 and signal processing section 3 and transmits the detected signals. With such an arrangement, since photodiodes 16 of PD array 15 and conductive members 21 of wiring substrate 20 are connected satisfactorily, a radiation detector, with which the transmission of the detected signals from radiation detecting section 1 to signal processing section 3 and the processing of the detected signals at signal processing section 3 can be performed securely, is realized.

In applying such a semiconductor device, comprising semiconductor elements and a wiring substrate, to a radiation detector, a substrate, formed of a predetermined glass material having a radiation shielding function, is preferably used as the glass substrate used in wiring substrate 20. The transmission of radiation from radiation detecting section 1, positioned at the upper surface 20a side of wiring substrate 20, to signal processing section 3, positioned at the lower surface 20b side, can thereby be restrained.

Glass materials containing lead can be cited as examples of such a glass material. In the case where lead glass is used, the amount of lead to be contained in the glass material is preferably set as suited in accordance with the degree of radiation shielding function, etc., that are required of the radiation detector. Also, a glass material having a radiation shielding function besides lead glass may be used instead. Or in cases where shielding of radiation is unnecessary or cases where the above-described semiconductor device is to be applied to a device other than a radiation detector, a glass material without a radiation shielding function may be used.

FIG. 5A and FIG. 5B are diagrams showing an example of a specific arrangement of through holes and conductive members in the wiring substrate and the connection with bump electrodes, with FIG. 5A showing a state prior to connection and FIG. 5B showing a state after connection.

As was described in relation to FIG. 1, with the present arrangement example, semiconductor device 5 is arranged using wiring substrate 20, wherein conductive members 21 are disposed at through holes 20c of the glass substrate formed from glass fibers, and PD array 15, having bump electrodes 17 formed so as to be in one-to-one correspondence with through holes 20c and conductive members 21.

With such an arrangement, in mounting PD array 15 onto wiring substrate 20, portions of bump electrodes 17 enter into the interiors of through holes 20c, provided with conductive members 21, as shown in FIG. 5B. The areas of contact of the bump electrodes with the conductive members are thereby increased, and photodiodes 16 of PD array 15 and the corresponding conductive members 21 of wiring substrate 20 are thus satisfactorily connected electrically and physically via bump electrodes 17. As conductive members 21 of wiring substrate 20, members formed on the inner walls of through holes 20c as shown in FIG. 4A and FIG. 4B are preferably used.

Here, with an arrangement wherein the semiconductor elements and the wiring substrate are connected using bump electrodes, problems in connection of the semiconductor elements with the wiring substrate may arise depending on the sizes, heights, positions, etc., of the bump electrodes. For example, with the example shown in FIG. 5A, four bump electrodes 17, provided on output surface 15b of PD array 15, are illustrated, and of these bump electrodes 17, the two at the inner side are somewhat small bump electrodes 171 and the two at the outer side are bump electrodes 172 that are larger than bump electrodes 171.

With such an arrangement, when PD array 15 is mounted onto wiring substrate 20, the gap between PD array 15 and wiring substrate 20 becomes uneven or the large bump electrodes become collapsed excessively. Also, in the case where the pitch of the bump electrodes is narrow, adjacent bump electrodes may contact each other and become shorted in the mounting process.

On the other hand, with wiring substrate 20 of the above-described arrangement, portions of bump electrodes 17 respectively enter into the interiors of through holes 20c, provided with the corresponding conductive members 21, in accordance with the sizes, heights, etc., of the respective bump electrodes 17 as shown in FIG. 5B. Bump electrodes 17 are thus prevented from collapsing excessively and spreading to the surroundings of the corresponding electrode pads, etc., in the mounting process. The bump electrodes therefore do not become shorted mutually and bump electrodes 17 can thus be connected satisfactorily with the corresponding conductive members 21.

With the arrangement shown in FIG. 1, FIG. 5A, and FIG. 5B, a predetermined range at the input surface 20a side of each through hole 20c provided in wiring substrate 20 is made a tapered part 20d. With such an arrangement, since the opening area (inner diameter of the circular shape) of each through hole 20c becomes larger at the input surface 20a side at which a bump electrode 17 is connected, the connection of bump electrode 17 to a conductive member 21 is guided by tapered part 20d and bump electrode 17 can enter readily into through hole 20c. Bump electrodes 17 can thus be connected securely to conductive members 21.

In general, such a through hole 20c of wiring substrate 20 is preferably formed so that the opening area at the input surface 20a will be greater than the opening area at a predetermined position (for example, a position within a range that includes the center position and wherein the opening area is fixed) in the interior of the glass substrate. As such an arrangement, various arrangements besides the above-described arrangement, wherein each through hole is provided with tapered shape at a predetermined range at the input surface side, may be used.

FIG. 6A and FIG. 6B are diagrams showing another example of a specific arrangement of through holes and conductive members in the wiring substrate and the connection with bump electrodes, with FIG. 6A showing a state prior to connection and FIG. 6B showing a state after connection.

With the present arrangement example, a predetermined range at the input surface 20a side of each through hole 20c provided in wiring substrate 20 is made a recessed part 20f, which is formed to a recessed shape of an opening area (inner diameter of a circular shape) that is larger than the opening area (inner diameter) in a range that includes a predetermined position (for example, the center position) in the interior of the glass substrate. As with the arrangement wherein a predetermined range at the input surface 20a side is made a tapered part 20d, with the present arrangement, by through holes 20c being made large in opening area at the input surface 20a side at which bump electrodes 17 are to be connected, bump electrodes 17 can be connected securely to conductive members 21.

Through holes 20c provided in wiring substrate 20 may be formed to have a cylindrical shape of fixed opening area (inner diameter of circular shape) and not provided with tapered parts 20d or recessed parts 20f, etc., which are changed in opening area at the input surface 20a side.

FIG. 7A and FIG. 7B are diagrams showing another example of a specific arrangement of through holes and conductive members in the wiring substrate and the connection with bump electrodes, with FIG. 7A showing a state prior to connection and FIG. 7B showing a state after connection.

With the example shown in FIG. 7A, four bump electrodes 17, provided on output surface 15b of PD array 15, are illustrated, and as with the example of FIG. 5A, of these bump electrodes 17, the two at the inner side are somewhat small bump electrodes 171 and the two at the outer side are bump electrodes 172 that are larger than bump electrodes 171.

On the other hand, with the present arrangement example, of the four through holes 20c corresponding to bump electrodes 17, the two at the inner side that correspond to bump electrodes 171 are arranged as through holes (first through holes) 201c, which are somewhat small in opening area, and the two at the outer side that correspond to bump electrodes 172 are arranged as through holes (second through holes) 202c, which are larger in opening area than through holes 201c.

With these structures, especially good effects are achieved by using solder, etc. of high wetting property with respect to metals as the bump electrode material and forming a metal of high wetting property with respect to solder at the top surfaces of the conductive members of the through holes.

With such an arrangement wherein through holes 201c and 202c that differ mutually in opening area are provided as through holes 20c in wiring substrate 20, the opening areas of the respective through holes 20c can be set favorably in accordance with the sizes, heights, etc., of the bump electrodes 17 to be connected to conductive members 21. Bump electrodes 17 can thereby be connected securely to the corresponding conductive members 21 regardless of differences in their sizes, heights, etc.

The glass substrate, used in the wiring substrate of the semiconductor device and the radiation detector shown in FIG. 1, and a method of manufacture thereof shall now be described using FIG. 8A to FIG. 11C. Here, a general arrangement example of a glass substrate having through holes and a method of manufacture thereof shall be described. Thus the glass substrate in the following description differs in shape and arrangement from the wiring substrate used in the radiation detector shown in FIG. 1.

Figure 8A:
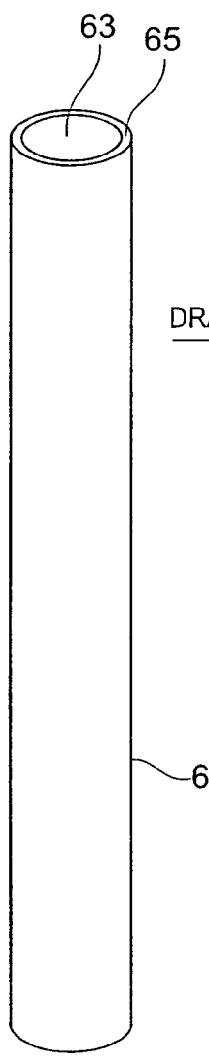
FIG. 8A to FIG. 8E are diagrams showing an example of a method of manufacturing a wiring substrate.
Figure 8B:

First as shown in FIG. 8A, a base material 61, comprising a core glass portion 63 and a coating glass portion 65, provided at the periphery of core glass portion 63, is prepared. This base material 61 is, for example, approximately 40 to 45 mm in outer diameter, with core glass portion 63 being, for example, approximately 28 to 31 mm in outer diameter. Core glass portion 63 is formed of acid-soluble glass, and coating glass portion 65 is formed of lead glass, soda lime glass, cobal glass, Pyrex glass, etc. Then as shown in FIG. 8B, base material 61 is drawn to prepare a glass fiber 67, which is a glass member of fiber-form. The outer diameter of the glass fiber 67 is, for example, approximately 0.4 mm.

Figure 8C:
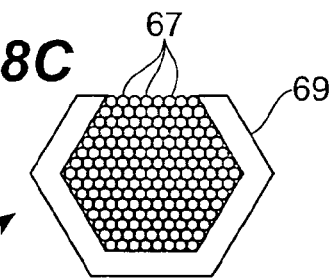
Figure 8D:
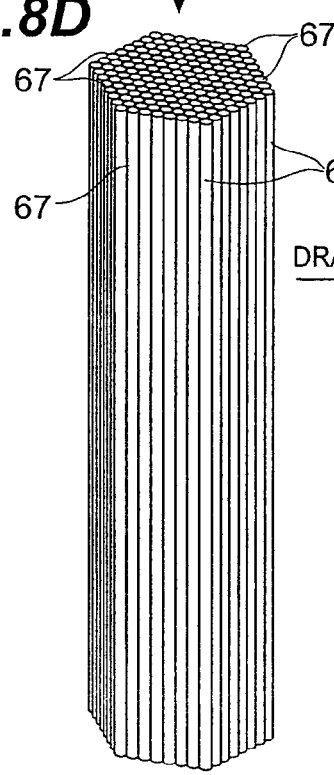

Then as shown in FIG. 8C, a plurality of the above-mentioned glass fibers 67 are bundled and aligned inside a predetermined mold 69. Here, a mold 69, having a hexagonal shape as viewed in the direction of the central axes of glass fibers 67, is used and approximately 10,000 glass fibers 67 are loaded inside the mold. Glass fibers 67 are thereby aligned to a hexagonal shape as viewed in the direction of their central axes as shown in FIG. 8D. Glass fibers 67 may instead be aligned to take on a triangular or rectangular shape as viewed in the direction of their central axes by using a mold having a triangular or rectangular shape as viewed in the direction of the central axes of glass fibers 67.

Figure 8E:
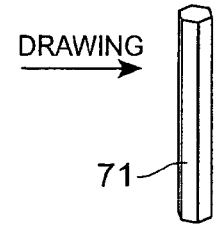

Then as shown in FIG. 8E, the bundle of glass fibers 67 are drawn in the aligned state to prepare a multi-fiber 71. Multi-fiber 71 is, for example, approximately 0.7 mm in outer diameter.

Then as shown in FIG. 9A, a plurality of the drawn multi-fibers 71 are aligned and fitted inside a predetermined glass tube 73. The inner diameter of glass tube 73 is approximately 100 mm. Then as shown in FIG. 9B, multi-fibers 71, which have been fitted inside glass tube 73, are fused to each other by heating. In this process, by connecting a glass tube 75, which is narrower than glass tube 73, to one end of glass tube 73 and using a rotary pump, etc., to exhaust air and lower the internal pressure, multi-fibers 71, which have been fitted inside glass tube 73, can be made to contact each other and glass tube 73 and fused without any gaps upon heating by atmospheric pressure.

The heating temperature is, for example, approximately 600 degrees, and the internal pressure is approximately 0.5 Pa. The other end of glass tube 73 is sealed. By the above process, a bundle-form glass member 77, wherein the plurality of multi-fibers 71 are fused inside glass tube 73, is formed.

Figure 10A:
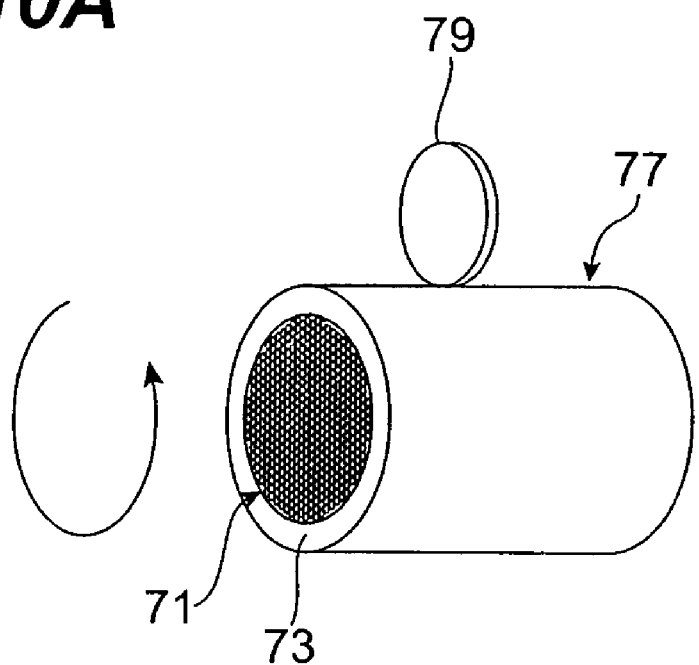
FIG. 10A and FIG. 10B are diagrams showing an example of a method of manufacturing a wiring substrate.

Glass tube 75 and the sealed portion are then removed. Thereafter, a grindstone 79, etc., is used to polish the outer periphery of glass tube 73 and shape of bundle-form glass member 77 is adjusted (outer diameter adjustment) as shown in FIG. 10A. A circumferential grinder may be used for this outer diameter adjustment.

Figure 10B:
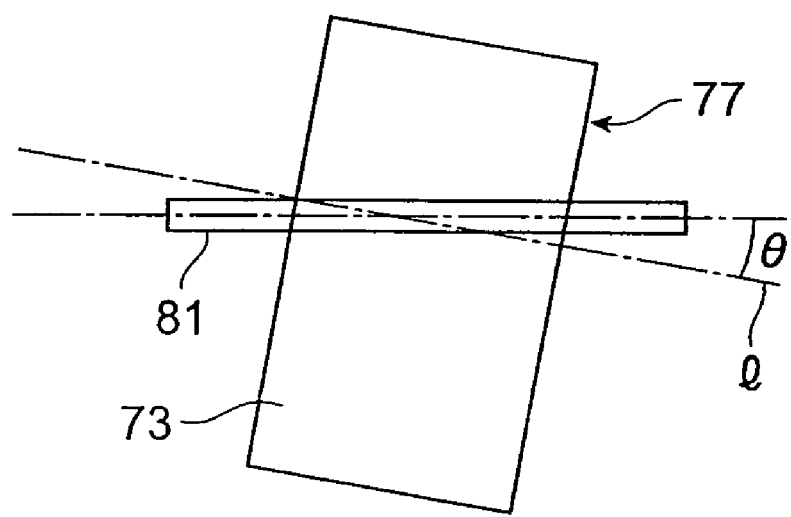

Then as shown in FIG. 10B, bundle-form glass member 77 is cut to a desired thickness. In this step, by cutting bundle-form glass member 77 along an axis 1 that is orthogonal to the central axis by means of a slicer 81, a glass substrate, with a shape with which the central axes of the through holes are axes perpendicular to the upper surface and lower surface, is obtained, as the wiring substrate 20 shown in FIG. 1.

Figure 11A:
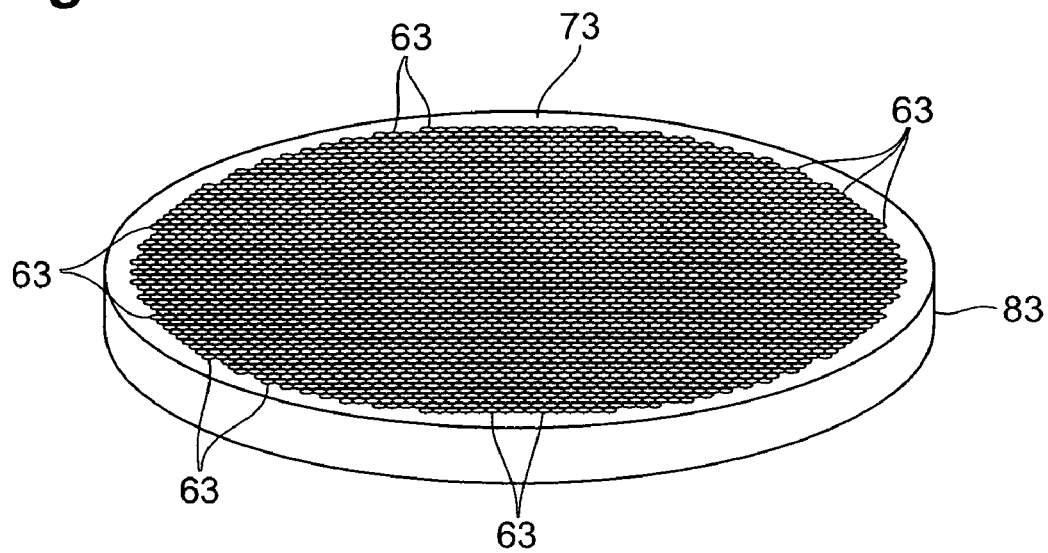
FIG. 11A to FIG. 11C are diagrams showing an example of a method of manufacturing a wiring substrate.
Figure 11B:
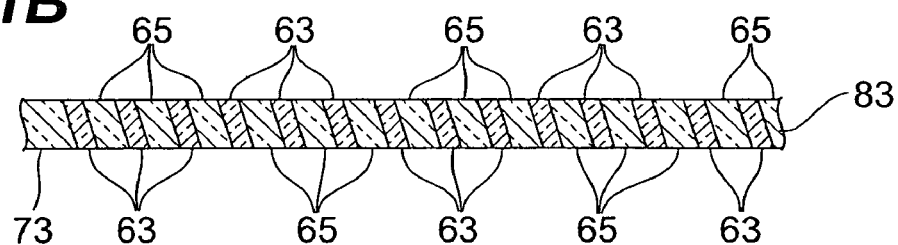

Or, bundle-form glass member 77 may be cut using slicer 81 obliquely at a predetermined angle θ with respect to axis 1, which is perpendicular to the central axis, as shown in FIG. 10B. The cut surface of the glass member that has been cut by slicer 81 is then polished. By these steps, a plate-form glass member 83 is formed as shown in FIG. 11A and FIG. 11B. Here, a glass member 83, which is obtained by cutting obliquely at the angle θ, is shown as an example.

Figure 11C:
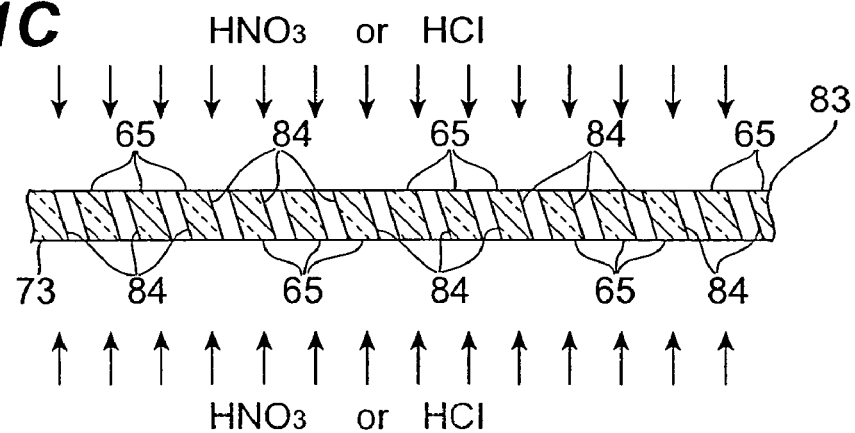

Then as shown in FIG. 11C, core glass portions 63 are removed from plate-like glass member 83 (core removal). Here, core glass portions 63 are removed by an etching technique that uses $HNO_3$ or HCl. A plurality of through holes 84, which pass through plate-like glass member 83 in the thickness direction, are thus formed and a glass substrate with through holes is formed.

As wiring substrate 20 of semiconductor device 5, shown in FIG. 1, and the radiation detector using the same, a substrate, with which conductive members that are to serve as conduction paths are formed in the through holes in the glass substrate obtained by the above-described manufacturing method, may be used for example. That is, the substrate shape and the number, positions, etc., of the through holes of the glass substrate of this arrangement are set in accordance with the arrangement of the radiation detector. Then by forming the conductive members that are to serve as conduction paths in the through holes provided in the glass substrate and then forming electrical wiring patterns, comprising the necessary electrodes and wirings, on the respective surfaces, a wiring substrate with the arrangement such as that shown in FIG. 3A and FIG. 3B is obtained.

A method of manufacturing the semiconductor device and the radiation detector shown in FIG. 1 shall now be described in outline along with specific arrangement examples thereof.

First, the glass substrate, which is formed by cutting the bundle-form glass member made by bundling the plurality of glass fibers as described above and is provided with through holes by removal of predetermined core glass portions, is prepared. Wiring substrate 20, used in semiconductor device 5 is then prepared by forming conductive members that are to serve as conduction paths in the through holes and furthermore forming electrical wiring patterns, having the necessary electrodes and wirings, on the respective surfaces that are to become the input surface and the output surface.

With the arrangement shown in FIG. 1, for the wiring substrate of semiconductor device 5, conductive members 21, each comprising conducting portion 21c, input portion 21a, and output portion 21b, are formed in through holes 20c provided in the glass substrate. Furthermore, electrode pads 22 and 24 and wirings 23 are formed on output surface 20b. Wiring substrate 20 is thus prepared.

The above-mentioned conductive members and electrical wiring patterns to be formed on the glass substrate may be formed of a conductive metal layer that is formed, for example, of titanium nitride (TiN), nickel (Ni), aluminum (Al), chromium (Cr), copper (Cu), silver (Ag), gold (Au), or an alloy of such metals. Such a metal layer may be a single metal layer, a composite film, or a layered film. As a specific method of forming such a layer, a metal layer may be formed by vapor deposition, CVD, plating, sputtering, etc., and patterning on the glass substrate may be performed by a photo-lithography or etching process. Or, a method of providing a mask of the desired pattern on the glass substrate, forming a metal layer by an above-mentioned method, and thereafter removing the mask may be employed. Also if necessary, bump electrodes may furthermore be formed on wiring substrate 20.

After preparing wiring substrate 20, an IC chip of signal processing element 30, having bump electrodes 31 formed thereon, is aligned with respect to electrode pads 22 disposed on output surface 20b of wiring substrate 20 and these are then connected physically and electrically. Also, PD array 15, having bump electrodes 17 formed thereon, is aligned with respect to input portions 21a of conductive members 21, which are disposed on input surface 20a of wiring substrate 20 and function as electrode pads, and these are then connected physically and electrically.

As the bump material for forming bump electrodes 31 and 17, nickel (Ni), copper (Cu), silver (Ag), gold (Au), solder, a resin containing a conductive filler, or a composite material of such materials may for example be used or arranged in a layer structure. Also, an under-bump metal (UBM) may be interposed between the bump electrodes and the electrode pads below.

Housing 40, on which bump electrodes 44 have been formed, is then aligned with respect to electrode pads 24 provided on output surface 20b of wiring substrate 20, and these are connected physically and electrically. By the above, input/output operations of signals with respect to an external circuit are enabled via leads 43 that are provided at housing 40. By then mounting scintillator 10 via optical adhesive agent 11 onto light-incident surface 15a of PD array 15, the radiation detector shown in FIG. 1 is obtained.

Here, in regard to PD array 15, which is provided as the semiconductor photodetecting element array in semiconductor device 5, a PD array of a front incident type, with which the photodiodes are formed on light-incident surface (front surface) 15a, may be used, or a PD array of a back incident type, with which the photodiodes are formed on signal output surface (back surface) 15b may be used. The number, alignment, etc. of the photodiodes that are the photodetecting elements can be set as suited.

Also, as the arrangement for outputting the detected signals from the photodiodes from output surface 15b, an arrangement of wiring patterns formed on output surface 15b or an arrangement of through electrodes formed in PD array 15, etc. may be employed, according to the specific arrangement of the PD array.

With the radiation detector shown in FIG. 1, an arrangement, having scintillator 10, which generates scintillation light upon incidence of radiation, and a PD array 15, which is provided with photodiodes 16 that are the semiconductor photodetecting elements that detect the scintillation light from scintillator 10, is employed as the arrangement of radiation detecting section 1. Such an arrangement is an indirect detection type arrangement, wherein an incident X-ray or other radiation is converted to light of a predetermined wavelength (for example, visible light) by means of scintillator 10 and then detected by an Si-PD array or other semiconductor photodetecting elements.

An arrangement, which is not provided with a scintillator but is provided with semiconductor detecting elements that detect the incident radiation, may be employed instead as the radiation detecting section. Such an arrangement is a direct detection type arrangement, wherein the incident X-ray of other radiation is detected by semiconductor detecting elements formed of CdTe, CdZnTe, etc. Such an arrangement can also be realized by making the thickness of Si adequately thick and thereby making it totally depleted and arranging a structure that enables incidence from the rear surface. This corresponds, for example, to an arrangement with which scintillator 10 is removed from the arrangement of FIG. 1 and PD array 15 is replaced by a semiconductor detecting element array. In this case, the semiconductor device is arranged by the semiconductor detecting element array and the wiring substrate.

The semiconductor device of the above-described arrangement comprising a semiconductor element and a wiring substrate can be applied to various devices besides a radiation detector. In such a case, elements other than semiconductor photodetecting elements and semiconductor detecting elements may be used as the semiconductor elements. Also, the semiconductor device may be arranged by providing, in addition to the wiring substrate and the semiconductor element that is connected to the signal input surface of the wiring substrate, a signal processing element that is connected to the signal output surface of the wiring substrate and thus providing a structure wherein the semiconductor element and the signal processing element, which processes the electrical signal from the semiconductor element, are made integral via the wiring substrate.

Also in regard to the connection of wiring substrate 20 and signal processing element 30, etc., it is preferable to use a direct bonding method of forming electrical connections via bump electrodes as in the above-described embodiment. By thus using metal bump electrodes as the electrical connection means, the respective components can be electrically connected favorably.

Also with the radiation detector shown in FIG. 1, apart from output portions 21b of conductive members 21, electrode pads 22 for connection of signal processing element 30 are provided on output surface 20b of wiring substrate 20. In regard to these electrode pads, output portions 21b of conductive members 21 may be used as they are as electrode pads.

Besides such an arrangement using bump electrodes, an arrangement, wherein filling by an underfill resin after making connections with the bump electrodes, an arrangement employing an anisotropic conductive film (ACF) method, an anisotropic conductive paste (ACP) method, or a non-conductive paste (NCP) method may also be used. In regard to the respective substrates, passivation films, formed of an insulating substance, may be formed as necessary in the state in which the electrode pads are open.

INDUSTRIAL APPLICABILITY

As has been described in detail above, this invention's semiconductor device and radiation detector using the same can be used as a semiconductor device and radiation detector using the same, wherein the semiconductor element and the corresponding conduction path of the wiring substrate are connected satisfactorily. That is, with an arrangement wherein a glass substrate, which is formed integrally from a plurality of glass fibers and having through holes, extending from the input surface to the output surface, formed at predetermined positions thereof, is used as the wiring substrate that connects the semiconductor elements, and the bump electrodes of the semiconductor elements are made to correspond in a one-to-one manner with the through holes and the conductive members to connect the semiconductor elements with the conductive members, which are the conduction paths of the wiring substrate, upon mounting the semiconductor elements onto the wiring substrate, a portion of each bump electrode enters into the interior of a through hole at which a conductive member is provided. A semiconductor device, with which the semiconductor elements and the corresponding conduction paths of the wiring substrate are connected satisfactorily via the bump electrodes, is thus realized.

With a radiation detector to which the semiconductor device of the above-described arrangement is applied, since the semiconductor elements and the corresponding conductive members of the wiring substrate are connected satisfactorily, a radiation detector, with which the transmission of the detected signals from radiation detecting means to signal processing means and the processing of detected signals at the signal processing means can be carried out securely is realized.

The invention claimed is:

1. A semiconductor device comprising:
   a semiconductor element, outputting an electrical signal; and
   a wiring substrate, provided with a conduction path, guiding the electrical signal between a signal input surface and a signal output surface, and connected to the semiconductor element at the signal input surface;
   the wiring substrate comprising: a glass substrate, formed by cutting a bundle-form glass member, formed by bundling fiber-form glass members, each comprising a core glass portion and a coating glass portion, provided at the periphery of the core glass portion, to a desired thickness and provided with a through hole by the removal of the core glass portion; and a conductive member, disposed in the through hole and functioning as the conduction path by providing electrical continuity between the signal input surface and the signal output surface; and
   the semiconductor element and the corresponding conductive member of the wiring substrate being electrically connected via a bump electrode that is formed on an output surface of the semiconductor element and in one-to-one correspondence with respect to the conductive member, wherein
   the semiconductor element is provided with, as the bump electrode, at least a first bump electrode, and a second bump electrode that is larger than the first bump electrode,
   the glass substrate is provided with, as the through hole, at least a first through hole, corresponding to the first bump electrode, of a predetermined opening area and a second through hole, corresponding to the second bump electrode, that is larger in opening area than the first through hole, the opening area of the second through hole at the signal input surface is larger than the opening area of the first through hole at the signal input surface, and a portion of the first bump electrode enters into the interior of the first through hole provided with the corresponding conductive member, and a portion of the second bump electrode enters into the interior of the second through hole provided with the corresponding conductive member.

2. The semiconductor device according to claim 1, wherein the conductive member is formed on the inner wall of the through hole provided in the glass substrate.

3. The semiconductor device according to claim 1, wherein the through hole of the glass substrate is formed so that the opening area at the signal input surface is larger than the opening area at a predetermined position in the interior of the glass substrate.

4. The semiconductor device according to claim 3, wherein the through hole of the glass substrate has a predetermined range thereof at the signal input surface side formed to a tapered shape, with which the opening area decreases gradually from the signal input surface towards the interior of the glass substrate.

5. The semiconductor device according to claim 3, wherein the through hole of the glass substrate has a predetermined range thereof at the signal input surface side formed to a recessed shape that is of a predetermined opening area that is greater than the opening area in a range that includes a predetermined position in the interior of the glass substrate.

6. The semiconductor device according to claim 1, further comprising signal processing means, connected to the signal output surface of the wiring substrate and processing the electrical signal from the semiconductor element.

7. A radiation detector, arranged so as to include the semiconductor device according to claim 6 and comprising:

radiation detecting means, including the semiconductor element and outputting the electrical signal upon detection of incident radiation;

the signal processing means, processing the electrical signal from the radiation detecting means; and a wiring substrate section, including the wiring substrate and having the signal input surface and the signal output surface being connected to the radiation detecting means and the signal processing means, respectively.

8. The radiation detector according to claim 7, wherein the glass substrate is formed of a predetermined glass material having a radiation shielding function.

9. The radiation detector according to claim 7, wherein the radiation detecting means comprises: a scintillator, generating scintillation light upon incidence of radiation; and the semiconductor element, detecting the scintillation light from the scintillator.

10. The radiation detector according to claim 7, wherein the radiation detecting means comprises the semiconductor element, detecting incident radiation.

* * * * *